United States Patent
Kearney

(10) Patent No.: US 7,619,273 B2
(45) Date of Patent: Nov. 17, 2009

(54) VARACTOR

(75) Inventor: Niall K Kearney, Dublin (IE)

(73) Assignee: Freescale Semiconductor, Inc., Austin, TX (US)

( * ) Notice: Subject to any disclaimer, the term of this patent is extended or adjusted under 35 U.S.C. 154(b) by 386 days.

(21) Appl. No.: 11/576,828

(22) PCT Filed: Oct. 6, 2004

(86) PCT No.: PCT/EP2004/052454

§ 371 (c)(1),
(2), (4) Date: Apr. 18, 2007

(87) PCT Pub. No.: WO2006/037376

PCT Pub. Date: Apr. 13, 2006

(65) Prior Publication Data

US 2009/0001518 A1    Jan. 1, 2009

(51) Int. Cl.
*H01L 29/93* (2006.01)

(52) U.S. Cl. .................. 257/312; 257/595; 257/596

(58) Field of Classification Search ............... 257/312, 257/532, 595, 596
See application file for complete search history.

(56) References Cited

U.S. PATENT DOCUMENTS

| | | | |
|---|---|---|---|
| 6,096,619 A | 8/2000 | Yamamoto et al. | |
| 6,172,378 B1 | 1/2001 | Hull et al. | |
| 6,407,312 B1 * | 6/2002 | Banno et al. | 800/278 |
| 6,906,904 B2 * | 6/2005 | Maget | 361/271 |
| 2002/0140109 A1 | 10/2002 | Keshavarzi et al. | |
| 2005/0067674 A1 * | 3/2005 | Maget | 257/595 |

OTHER PUBLICATIONS

Maget, et al., "Novel Varactors in BiCMOS Technology with Improved Characteristics", 13th Int. Conf. on Microelectronics 2001, Oct. 29-31, 2001, pp. 59-62.

* cited by examiner

*Primary Examiner*—Roy K Potter

(57) ABSTRACT

A varactor comprising a first layer separated from a second layer by an insulating layer, wherein the first layer is a first type of semiconductor material and the second layer is a second type of semiconductor material and the insulation layer is arranged to allow an accumulation region to be formed in the first layer and second layer when a positive bias is applied to the first layer and the second layer and a depletion region to be formed in the first layer and second layer when a negative bias is applied to the first layer and the second layer.

14 Claims, 1 Drawing Sheet

VARACTOR

FIELD OF THE INVENTION

The present invention relates to a varactor.

BACKGROUND OF THE INVENTION

Varactors (variable reactors) are frequently employed in integrated circuits (ICs) to provide a degree of frequency tunability for circuits incorporated within the ICs, whereby a voltage is applied across the terminals of a varactor to control a depletion region width, and consequently vary the capacitance of the varactor.

A key feature of a varactor is the ratio of maximum to minimum capacitance variation achievable ($C_{max}/C_{min}$). A large $C_{max}/C_{min}$ ratio is advantageous for providing a greater tuning range (for example, in voltage controlled oscillator (VCO) circuits) and for providing a greater difference between the on and off impedances when a varactor is used in RF switching applications.

One type of varactor that has been used in integrated circuits is the P-N junction diode, which comprises a p-type semiconductor layer abutting an n-type semiconductor layer. When a negative bias voltage ($V_{bias}$) is applied across the terminals of a P-N junction diode a depletion region that is formed at the interface between the p-type semiconductor layer and the n-type semiconductor layer widens causing the capacitance of the varactor to decrease.

Accordingly, the minimum capacitance value for a P-N varactor can be considered to be the series combination of the two depletion capacitances of the p-type and n-type layers. As such the minimum capacitance value will be less than the constituent depletion capacitances.

If, however, $V_{bias}$ is made positive the varactor capacitance will begin to be dominated by charge storage effects, and will be proportional to the carrier recombination lifetime.

Under these operating conditions $V_{bias}$ must be carefully controlled to avoid forward biasing, which can occur when a large AC signal is superimposed upon $V_{bias}$. Forward biasing leads to the formation of a low resistance DC path through the diode, which can seriously degrade the operation of circuits such as VCO's.

Another increasingly commonly used integrated varactor is a MOS-C varactor, which comprises a metal or polysilicon gate separated from a doped bulk semiconductor region by a thin insulating layer, for example silicon dioxide.

The minimum capacitance value for a MOS-C varactor can be considered to be the series combination of a capacitance associated with the insulation layer and a depletion capacitance associated with the doped bulk semiconductor region. As such the minimum capacitance value will be less than the constituent capacitances. The maximum capacitance value for a MOS-C varactor is limited to the capacitance associated with the insulation layer However, it is desirable to have an integrated varactor that has an improved $C_{max}/C_{min}$ ratio.

STATEMENT OF INVENTION

The present invention provides a varactor as described in the accompanying claims.

This provides the advantage of allowing the minimum capacitance to equate to a series combination of three capacitors, a capacitance associated with a depletion region for the first layer, a capacitance associated with a depletion region for the second layer and a capacitance associated with the insulation layer, thereby increasing the $C_{max}/C_{min}$ ratio.

BRIEF DESCRIPTION OF THE DRAWINGS

The present invention will now be described, by way of example, with reference to the accompanying drawings, in which.

DESCRIPTION OF A PREFERRED EMBODIMENT

Figure 1:
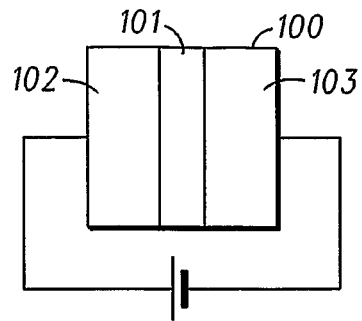
FIG. 1 shows a varactor according to a first embodiment of the present invention.

FIG. 1 shows a varactor 100 having an insulation layer 101, which in this embodiment is an oxide layer for example silicon dioxide, sandwiched between two semiconductor layers of different semiconductor types, where one semiconductor layer 102 is a p-type and the other semiconductor layer 103 is an n-type. However, it should be noted that any suitable insulating material could be used, for example $HfO_2$, $HfSiO_x$:N, $ZrO_2$, $Y_2O_3$, $SiO_2$.

The thickness of the different layers will be determined by doping densities and/or fabrication equipment.

For gate oxide thickness a typical thickness for a SiO2 oxide layer would be between 50 and 35 Angstrom. The thinner the oxide layer the higher the Cmax, however fringing effects can limit Cmin.

Figure 2:
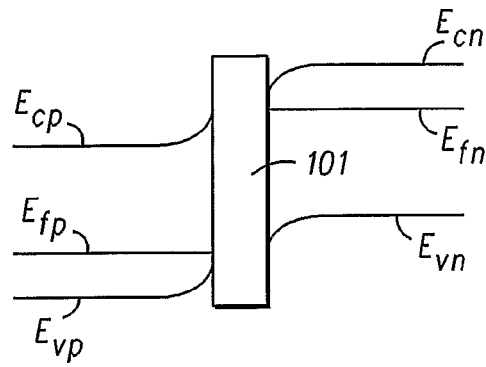
FIG. 2 shows a Fermi distribution function for when a positive bias voltage is applied to a varactor according to an embodiment of the present invention.

FIG. 2 shows an energy band diagram and Fermi level for the varactor 100 shown in FIG. 1 when a positive bias voltage has been applied to the varactor 100.

As shown in FIG. 2, $E_{cp}$ is the edge of the conduction band in the p-type semiconductor material 102 and $E_{vp}$ is the edge of the valence band. $E_{cn}$ is the edge of the conduction band in the n-type semiconductor material 103 and $E_{vn}$ is the edge of the valence band. $E_{fp}$ and $E_{fn}$ are the equilibrium Fermi levels in the p-type and n-type semiconductor material respectively 102, 103.

The positive bias voltage $V_{bias}$ causes the valence band $E_{vp}$ in the p-type semiconductor material 102 and the conduction band $E_{cn}$ in the n-type semiconductor material 103 to bend towards their respective Fermi levels $E_{fp}$, $E_{fn}$ at the insulation layer 101 (e.g. oxide layer) and the n-type semiconductor material and the p-type semiconductor material interfaces, thereby forming accumulation regions on either side of the insulation layer 101. In this condition the capacitance of the varactor 100 is a maximum, and is primarily determined by the capacitance of the insulating layer 101. Therefore the maximum capacitance is given by:

$$C_{max} = C_{ox}$$

Figure 3:
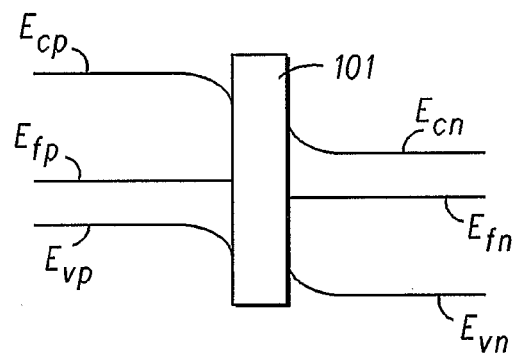
FIG. 3 shows a Fermi distribution function for when a negative bias voltage is applied to a varactor according to an embodiment of the present invention.

As shown in FIG. 3, when a negative bias voltage $V_{bias}$ is applied to the varactor 100 the valence band $E_{vp}$ in the p-type semiconductor material 102 and the conduction band $E_{cn}$ in the n-type semiconductor material 103 bend away from their respective Fermi levels at the interface between the insulation layer 101 and the n-type semiconductor material 103 and the p-type semiconductor material 102, thereby forming a depletion region on either side of the insulation layer 101. In this condition the capacitance of the varactor 100 is a minimum and can be considered to be the series combination of three capacitors: the capacitance $C_{dep,p}$ of the depletion region in the p-type semiconductor material 102, the capacitance $C_{dep,n}$ of the depletion region in the n-type semiconductor material 103, and the capacitance COX of the insulation layer 101.

Accordingly, $C_{min}$ is given by the following equation:

$$C_{\min} = \frac{C_{dep,p} \cdot C_{ox} \cdot C_{dep,n}}{C_{dep,p} \cdot C_{ox} + C_{ox} \cdot C_{dep,n} + C_{dep,n} \cdot C_{dep,p}}$$

This minimum capacitance is lower than that typically achieved by a standard gate MOS-C varactor due to the extra series capacitance (i.e. the depletion capacitance in the gate material) that is not present in a standard MOS-C device.

Figure 4:
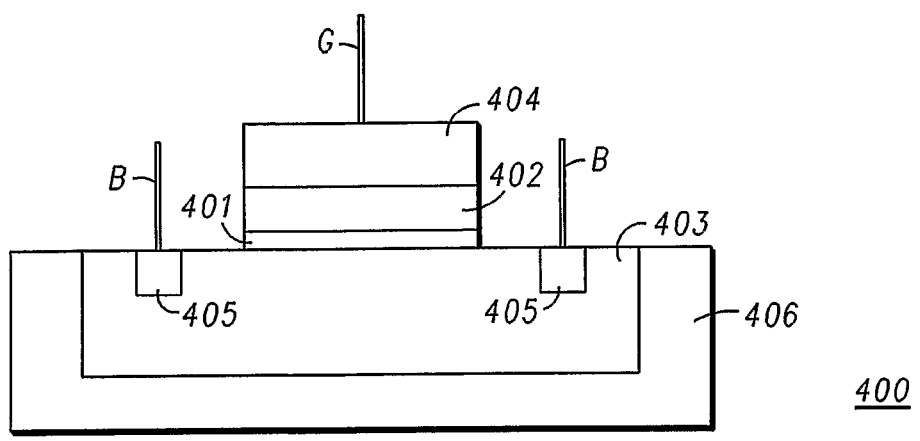
FIG. 4 shows a varactor according to a second embodiment of the present invention.

FIG. 4 illustrates a preferred embodiment of a varactor 400, which provides for the formation of a depletion region within the gate material of the varactor 400 under negative bias voltage conditions.

The varactor has an oxide layer 401 sandwiched between a p-type semiconductor material layer 402 and an n-type semiconductor material layer 403. Formed on the p-type layer 402 is a p+ layer 404, opposite to the oxide layer, which forms a gate for the varactor 400. Formed in the n-type layer 403 are two n+ regions 405, which form the bulk terminals for the varactor 400. The varactor 400 is formed in a p– type semiconductor substrate 406.

One method for fabricating the varactor would be to form an oxide layer on the p-type semiconductor substrate 406 upon which the gate material is fabricated with the desired doping profile for the gate material being achieved, for example, by depositing Si/SiGe films amorphously on the gate oxide material and controlling the doping concentrations of successive layers. Further, carbon can be added to slow unwanted boron diffusion during subsequent processing. In such a fashion the p region and p+ regions can be realised. However, as would be appreciated by a person skilled in the art other techniques could be used.

The invention claimed is:

1. A varactor comprising
   a first layer separated from a second layer by an insulating layer, wherein the first layer is a p type of semiconductor material and the second layer is a n type of semiconductor material;
   wherein the insulation layer is arranged to allow an accumulation region to be formed in the first layer and second layer when a positive bias is applied to the first layer and the second layer; and
   a depletion region to be formed in the first layer and second layer when a negative bias is applied to the first layer and the second layer, the varactor characterized in that the first layer has a first doping p type region formed at the boundary to the insulating layer and a second p+ doping region formed on top of the first doping p type region.

2. A varactor according to claim 1, wherein the doping impurities of the first layer and the second layer are arranged to be reduced at the boundary to the insulation layer to aid the formation of a depletion region within the first layer and second layer.

3. A varactor according to claim 1, wherein the first doping region has a reduced number of doping impurities compared to the second doping region to aid the formation of a depletion region within the first layer.

4. A varactor according to claim 3, wherein the second layer comprises a first n doping region and a second n+ doping region.

5. A varactor according to claim 1, wherein:
   the second layer has a first doping region formed at the boundary to the insulation layer and a second doping region;
   the first doping region has a reduced number of doping impurities compared to the second doping region to aid the formation of a depletion region within the second layer.

6. A varactor according to claim 1, wherein the insulation layer is an oxide layer.

7. A varactor according to claim 2, wherein the first doping region has a reduced number of doping impurities compared to the second doping region to aid the formation of a depletion region within the first layer.

8. A varactor according to claim 2, wherein:
   the second layer has a first doping region formed at the boundary to the insulation layer and a second doping region;
   the first doping region has a reduced number of doping impurities compared to the second doping region to aid the formation of a depletion region within the second layer.

9. A varactor according to claim 3, wherein:
   the second layer has a first doping region formed at the boundary to the insulation layer and a second doping region;
   the first doping region has a reduced number of doping impurities compared to the second doping region to aid the formation of a depletion region within the second layer.

10. A varactor according to claim 4, wherein:
    the second layer has a first doping region formed at the boundary to the insulation layer and a second doping region;
    the first doping region has a reduced number of doping impurities compared to the second doping region to aid the formation of a depletion region within the second layer.

11. A varactor according to claim 2, wherein the insulation layer is an oxide layer.

12. A varactor according to claim 3, wherein the insulation layer is an oxide layer.

13. A varactor according to claim 4, wherein the insulation layer is an oxide layer.

14. A varactor according to claim 5, wherein the insulation layer is an oxide layer.

* * * * *